(12) United States Patent
Lee et al.

(10) Patent No.: US 7,841,505 B2
(45) Date of Patent: Nov. 30, 2010

(54) WIRE CLAMP AND WIRE BONDING APPARATUS HAVING THE SAME

(75) Inventors: Sung-Soo Lee, Cheonan-si (KR);
Ki-Taik Oh, Cheonan-si (KR);
Jung-Hyeon Kim, Hwaseong-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 103 days.

(21) Appl. No.: 12/320,964

(22) Filed: Feb. 10, 2009

(65) Prior Publication Data

US 2009/0200357 A1  Aug. 13, 2009

(30) Foreign Application Priority Data

Feb. 12, 2008  (KR) ..................... 10-2008-0012638

(51) Int. Cl.
*B23K 37/00* (2006.01)
(52) U.S. Cl. ............... 228/44.7; 228/44.3; 228/212; 228/213
(58) Field of Classification Search .......... 228/4.5, 228/180.5, 904, 44.3, 44.7, 212, 213
See application file for complete search history.

(56) References Cited

U.S. PATENT DOCUMENTS 5,186,648 A * 2/1993 Senra ..................... 439/409
5,435,477 A * 7/1995 Torihata et al. ........... 228/4.5

FOREIGN PATENT DOCUMENTS

| JP | 06-140476 A | 5/1994 |
|---|---|---|
| JP | 2002-158253 A | 5/2002 |
| KR | 10-2002-0053931 A | 7/2002 |

* cited by examiner

*Primary Examiner*—Jessica L Ward
*Assistant Examiner*—Megha Mehta
(74) *Attorney, Agent, or Firm*—Lee & Morse, P.C.

(57) ABSTRACT

A wire clamp includes a pair of clamp arms at a predetermined distance from each other to define an interval therebetween for a bonding wire, a clamp body coupled to the clamp arms, the clamp body configured to adjust the predetermined distance between the clamp arms with respect to a process to be performed, a clamping section in each clamp arm, the clamping section having concave portions facing the interval between the clamp arms, the concave portions being configured to contact the bonding wire when the clamp arms are brought close together, and at least one abrasion prevention member in each clamping section, the abrasion prevention members being configured to prevent abrasion during contact with the bonding wire.

17 Claims, 5 Drawing Sheets

WIRE CLAMP AND WIRE BONDING APPARATUS HAVING THE SAME

BACKGROUND

1. Field

Exemplary embodiments relate to a wire clamp and a wire bonding apparatus having the same.

2. Description of the Related Art

Semiconductor packages may be manufactured using a series of assembly processes, e.g., a sawing process, a die bonding process, a wire bonding process, a molding process, a marking process, and so on. Among the assembly processes, the wire bonding process may refer to a process bonding a pad of a semiconductor chip with another pad, e.g., a lead of a lead frame or a pad of another semiconductor chip, by a bonding wire.

A conventional wire bonding process may include a device depositing a bonding wire via, e.g., a capillary, onto the two pads to be bonded, such that the two pads may be electrically connected to each other through the bonding wire. The device may further include a clamp for the bonding wire and a wire bonding monitoring system (WBMS) for monitoring whether the wire bonding processes is performed smoothly. For example, the WBMS may send detection current through the bonding wire and the clamp to measure impedance, thereby determining whether a proper electrical connection/disconnection exists.

The conventional clamp for the bonding wire, however, may be contaminated when the wire bonding process is performed for a long time. As a result, the WBMS may measure an incorrect impedance value, e.g., the WBMS may measure an impedance value that corresponds to the contaminants and not to an actual wire bonding state, thereby generating an incorrect signal regarding the electrical connection of the bonding wire. Consequently, manufacturing defects in the bonding wire and/or process irregularities, e.g., unnecessary process discontinuance, may be caused. Further, the conventional clamp for the bonding wire may be formed of a material vulnerable to abrasion, i.e., a material with low rigidity, thereby causing abrasion of the clamp when the wire bonding process is performed for a long time, e.g., due to friction and natural machine deterioration. As a result, clamping in the wire bonding process may not be performed properly, so the bonding wire may not be reliably clamped and/or supported, thereby causing defects in the resultant bonding wire or irregularities in the process.

SUMMARY

Exemplary embodiments are therefore directed to a wire clamp and a wire bonding apparatus having the same, which substantially overcome one or more of the disadvantages and shortcomings of the related art.

It is therefore a feature of an exemplary embodiment to provide a wire clamp having a structure capable of significantly reducing contamination and abrasion therein.

It is another feature of an exemplary embodiment to provide a wire clamp having a structure capable of controlling a wire bonding process through a wire bonding monitoring system (WBMS) while significantly reducing contamination and abrasion.

It is yet another feature of an exemplary embodiment to provide a wire bonding apparatus including a wire clamp having one or more of the above features.

At least one of the above and other features and advantages may be realized by providing a wire clamp, including a pair of clamp arms at a predetermined distance from each other to define an interval therebetween for a bonding wire, a clamp body coupled to the clamp arms, the clamp body configured to adjust the predetermined distance between the clamp arms with respect to a process to be performed, a clamping section in each clamp arm, the clamping section having concave portions facing the interval between the clamp arms, the concave portions being configured to contact the bonding wire when the clamp arms are brought close together, and at least one abrasion prevention member in each clamping section, the abrasion prevention members being configured to prevent abrasion during contact with the bonding wire.

Each clamping section may include a plurality of abrasion prevention members, the abrasion prevention members being disposed at even intervals from each other, the intervals being measured along a direction parallel to a direction of the bonding wire. Surfaces of the clamping sections and surfaces of the abrasion prevention members may be configured to contact a surface of the bonding wire when the clamp arms are brought close together. Surfaces of the abrasion prevention members facing the interval between the clamp arms may include concave portions, the concave portion corresponding to a convex surface of the bonding wire. The surfaces of the clamping sections and of the abrasion prevention members configured to contact the bonding wire may be substantially smooth. The abrasion prevention members may include a hard material, the hard material exhibiting no abrasion when contacted by the bonding wire. The hard material may be diamond.

The clamp arms and the clamping sections may include a conductive material, and the abrasion prevention members may be positioned perpendicularly to a first surface of the bonding wire, the first surface of the bonding wire being configured to contact the abrasion prevention members. Each abrasion prevention member may be positioned between portions of a corresponding clamping section in an alternating pattern. Surfaces of the abrasion prevention members facing the interval between the clamp arms may include concave portions, surfaces of the concave portions of the abrasion prevention members and surfaces of the concave portions of the corresponding clamping sections being substantially coplanar. At least a first surface of each abrasion prevention member may be in direct contact with a corresponding clamping section, and a second surface of each abrasion prevention member may be in direct contact with the bonding wire when the clamp arms are brought close together, the first and second surfaces being different from each other.

At least one of the above and other features and advantages may be realized by providing a wire bonding apparatus, including a capillary configured to guide a bonding wire to predetermined regions, the capillary being movable between the predetermined regions, and a wire clamp including a pair of clamp arms at a predetermined distance from each other to define an interval therebetween for a bonding wire, the pair of clamp arms being configured to control supply of the bonding wire to the capillary, a clamp body coupled to the clamp arms, the clamp body configured to adjust the predetermined distance between the clamp arms with respect to a process to be performed, a clamping section in each clamp arm, the clamping section having concave portions facing the interval between the clamp arms, the concave portions being configured to contact the bonding wire when the clamp arms are brought close together, and at least one abrasion prevention member in each clamping section, the abrasion prevention members being configured to prevent abrasion during contact with the bonding wire.

Each clamping section may include a plurality of abrasion prevention members, the abrasion prevention members being disposed at even intervals from each other, the intervals being measured along a direction parallel to a direction of the bonding wire. Surfaces of the clamping sections and surfaces of the abrasion prevention members may be configured to contact a surface of the bonding wire. Surfaces of the abrasion prevention members facing the bonding wire may have a concave shape, the concave shape corresponding to a convex surface of the bonding wire. The surfaces of the clamping sections and the abrasion prevention members configured to contact the bonding wire may be substantially smooth. The abrasion prevention members may include a hard material, the hard material exhibiting no abrasion when contacted by the bonding wire. The hard material may be diamond. The clamp arms and the clamping sections may include a conductive material, and the abrasion prevention members may be positioned perpendicularly to a first surface of the bonding wire, the first surface of the bonding wire being configured to contact the abrasion prevention members.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE INVENTION

Figure 1:
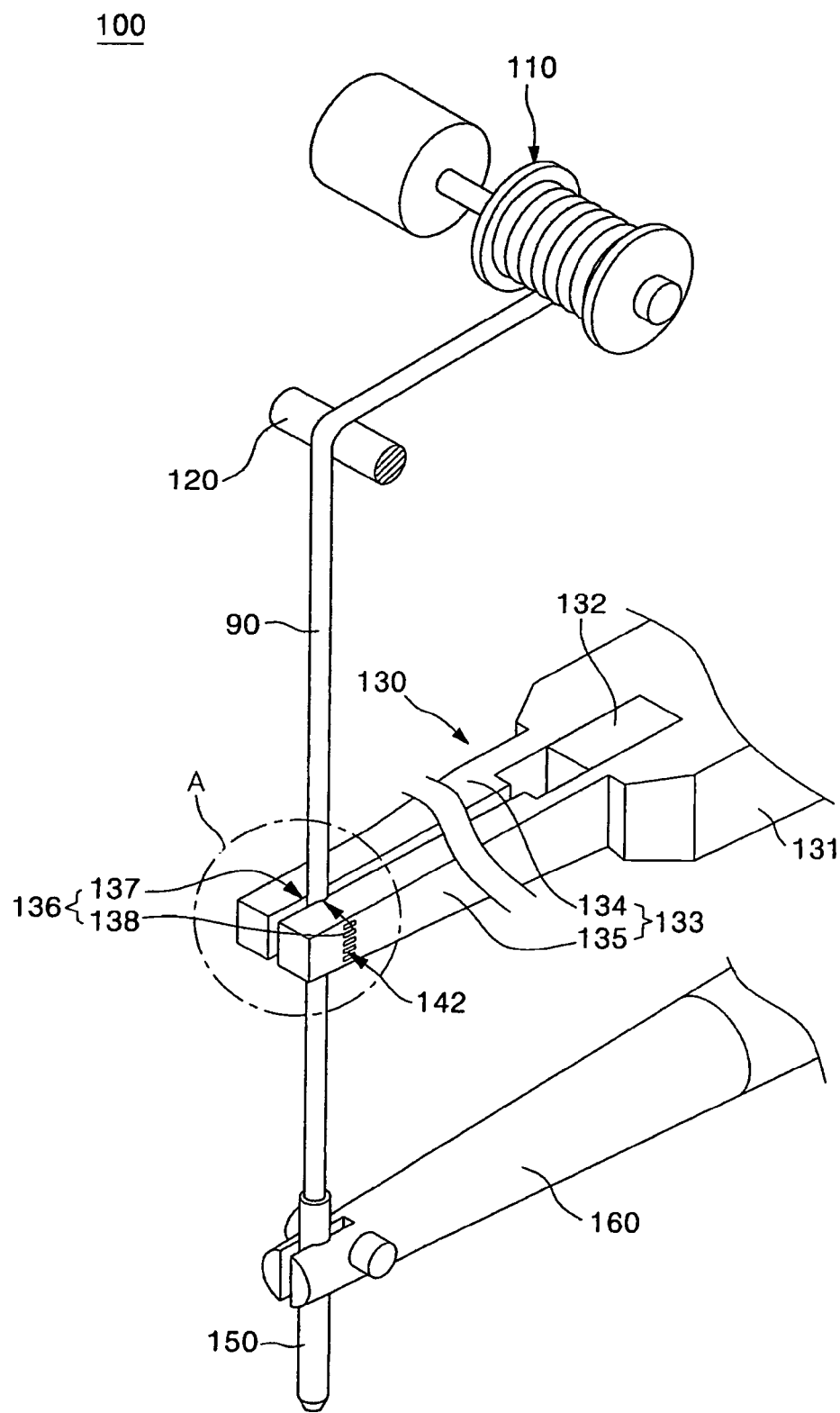
FIG. 1 illustrates a perspective view of a wire bonding apparatus according to an exemplary embodiment.

Korean Patent Application No. 10-2008-0012638, filed on Feb. 12, 2008, in the Korean Intellectual Property Office, and entitled: "Wire Clamp and Wire Bonding Apparatus Having the Same," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the terms "a" and "an" are open terms that may be used in conjunction with singular items or with plural items.

Figure 2:
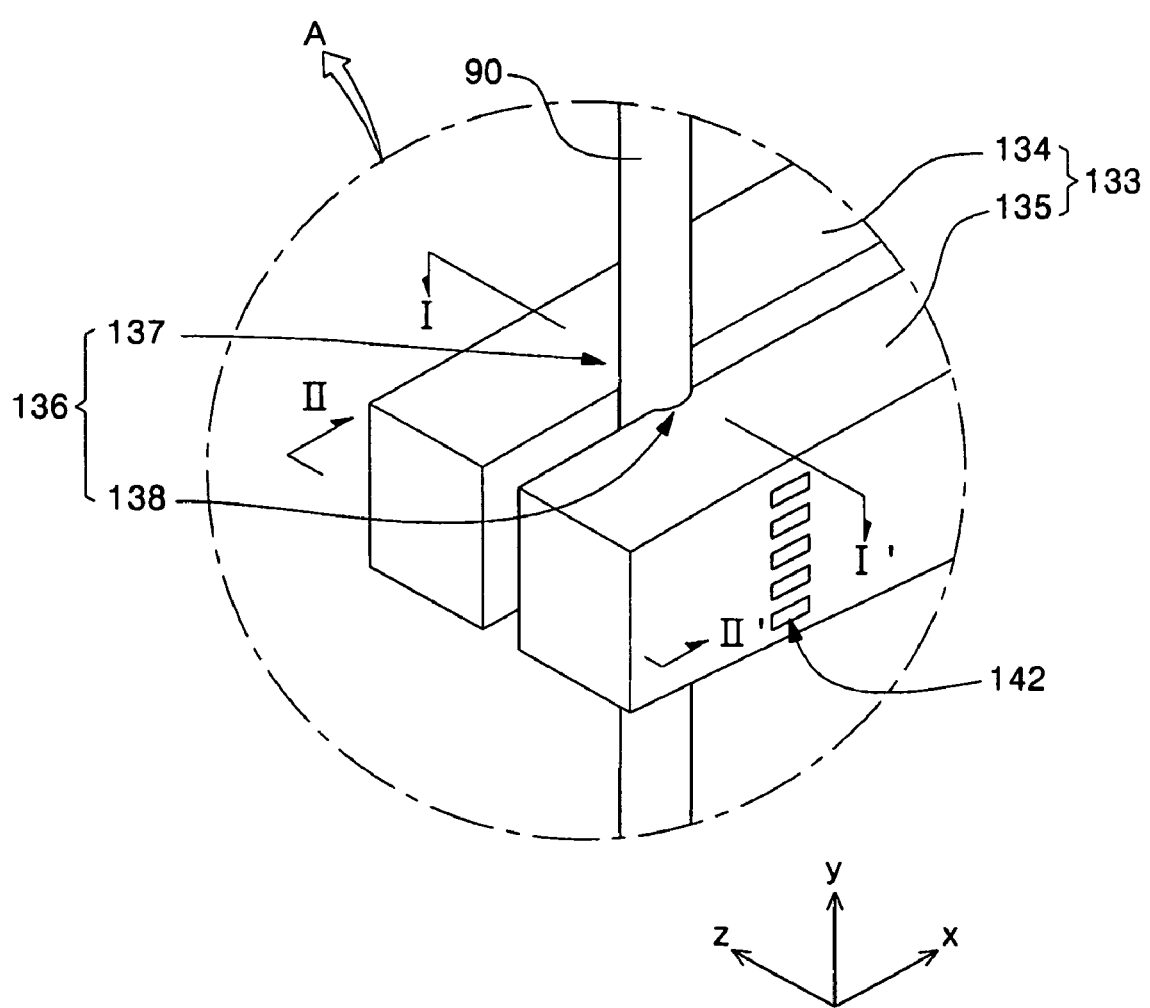
FIG. 2 illustrates an enlarged, perspective view of portion A of FIG. 1.
Figure 3:
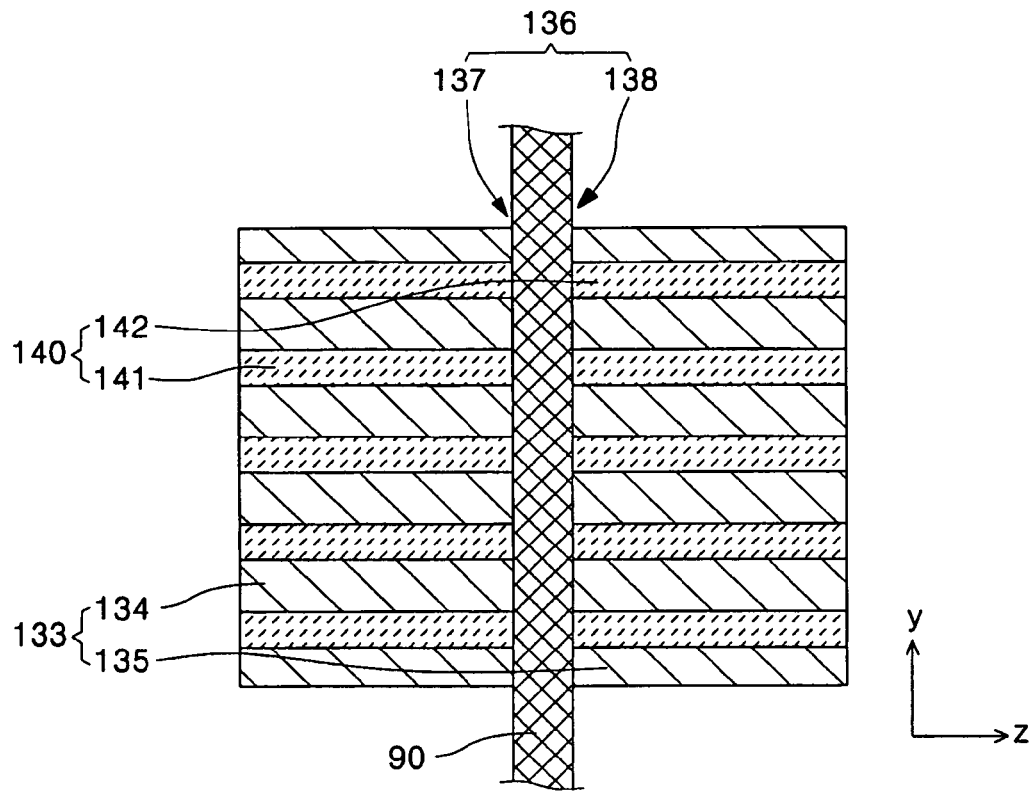
FIG. 3 illustrates a cross-sectional view of a clamp arm in a wire clamp of FIG. 2 along line I-I'.
Figure 4:
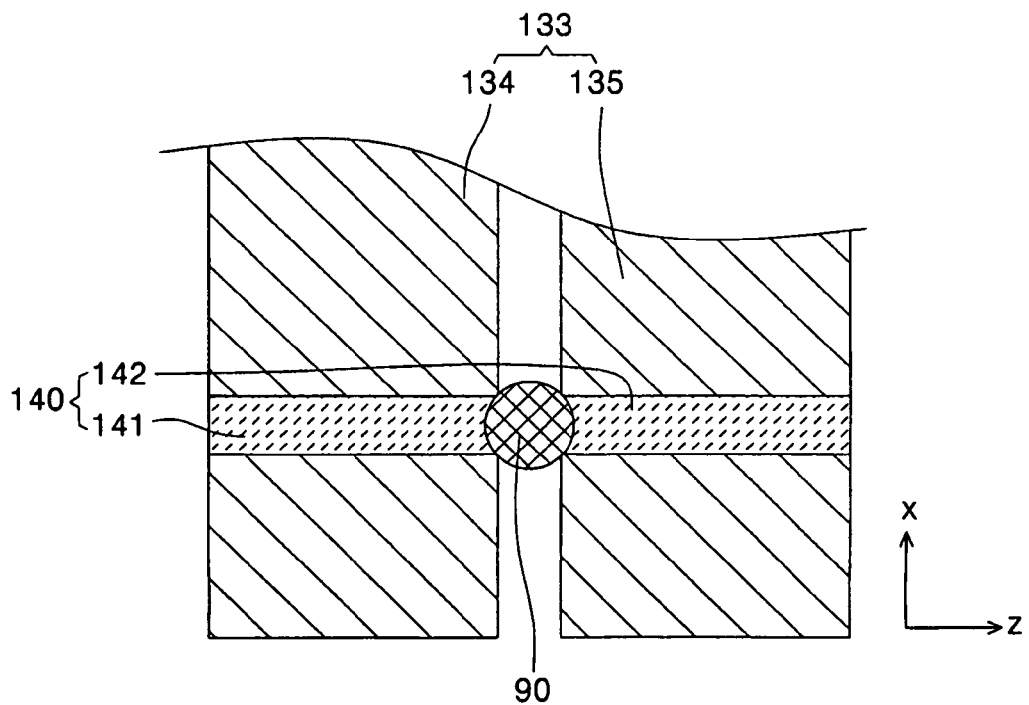
FIG. 4 illustrates a cross-sectional view of the clamp arm in a wire clamp of FIG. 2 along line II-II'.
Figure 5:
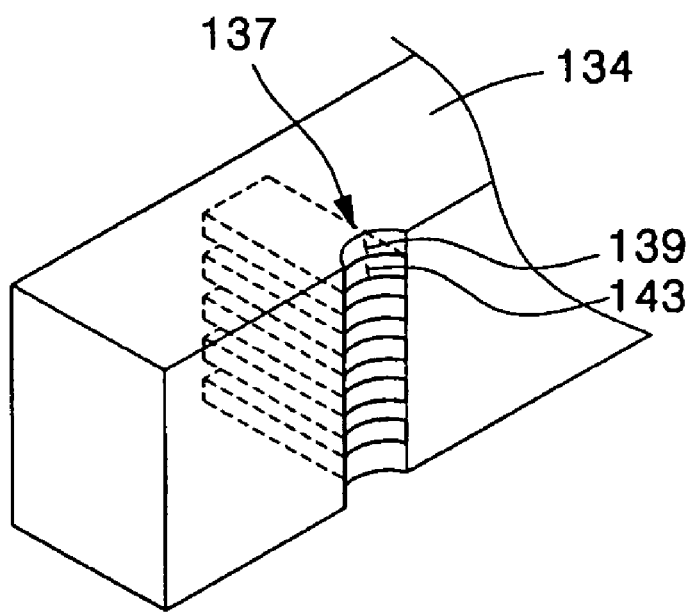
FIG. 5 illustrates a perspective view of the clamp arm in a wire clamp of FIG. 2.
Figure 6:
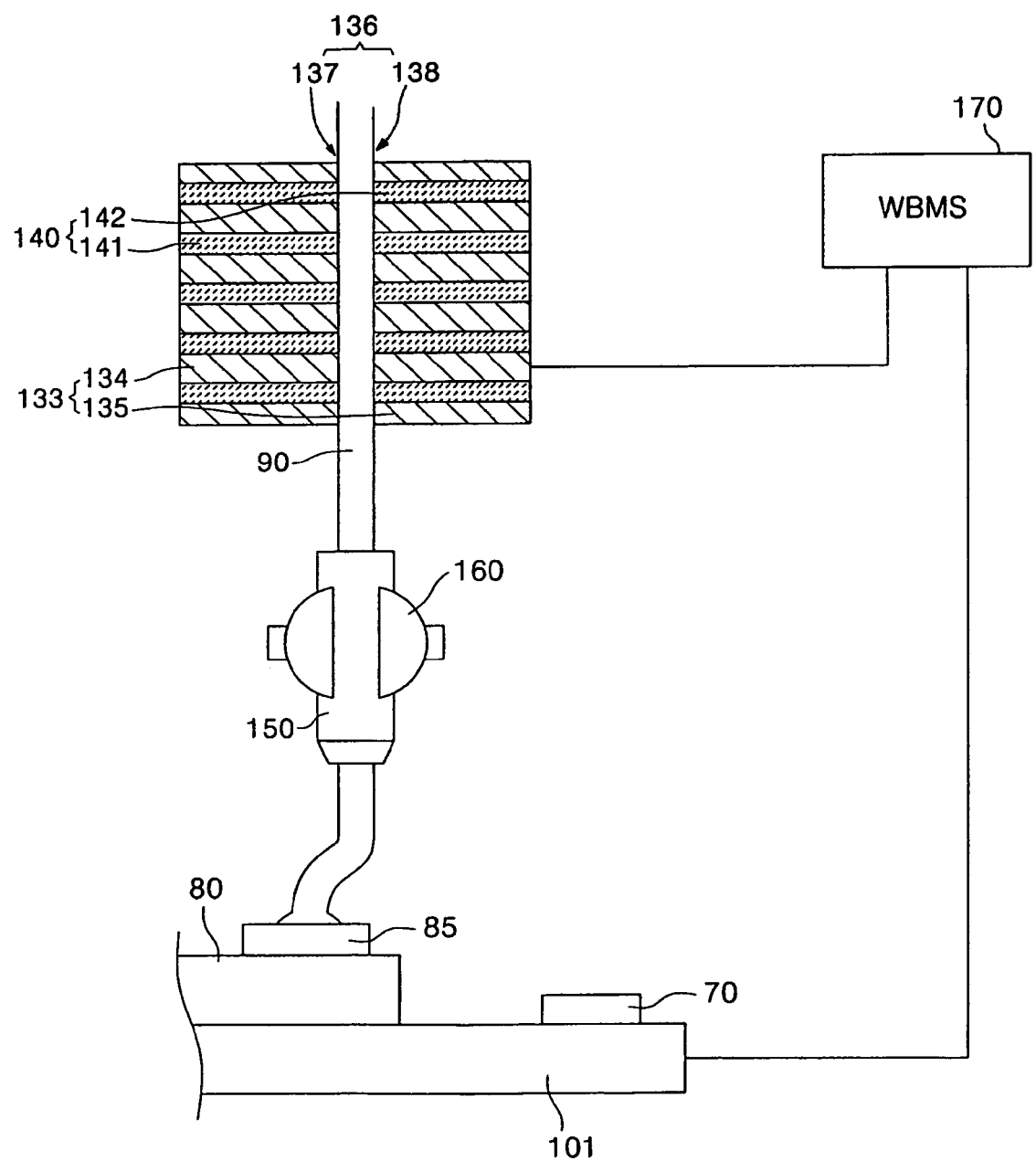
FIG. 6 illustrates a schematic diagram of monitoring a wire bonding process by a wire bonding apparatus according to an exemplary embodiment.

FIG. 1 illustrates a perspective view of a wire bonding apparatus according to an exemplary embodiment. FIG. 2 illustrates an expanded view of a portion A of FIG. 1. FIG. 3 illustrates a cross-sectional view of a clamp arm of a wire clamp in FIG. 2, taken along line I-I'. FIG. 4 illustrates a cross-sectional view of the clamp arm of the wire clamp in FIG. 2, taken along line II-II'. FIG. 5 illustrates a perspective view of the clamp arm of the wire clamp in FIG. 2. FIG. 6 illustrates a diagram for explaining monitoring of a wire bonding process by the wire bonding apparatus according to an exemplary embodiment.

Referring to FIG. 1, a wire bonding apparatus 100 may include a wire spool 110 with a bonding wire 90, a capillary 150 for guiding the bonding wire 90 in a predetermined direction, a wire clamp 130 for controlling supply of the bonding wire 90 from the wire spool 110 to the capillary 150, a diverter 120 between the wire clamp 130 and the wire spool 110 to maintain tension of the bonding wire 90, an ultrasonic transducer 160 for applying ultrasonic vibrations to the bonding wire 90, and a wire bonding monitoring system (WBMS) 170 for monitoring a wire bonding process. As illustrated in FIG. 6, the wire bonding apparatus 100 may electrically connect a pad 85 of a semiconductor chip 80 to a lead 70 of a lead frame (not shown) by quickly moving the capillary 150 between desired regions of the pad 85 and the lead 70, so the bonding wire 90 may electrically connect the desired regions of the semiconductor chip 80 and the lead 70. As further illustrated in FIG. 6, the semiconductor chip 80 and the lead 70 may be disposed on a heat block 101.

The heat block 101 may heat the semiconductor chip 80 and the lead frame in order to smoothly perform a bonding operation. In other words, when the semiconductor chip 80 having the pad 85 formed on the semiconductor chip 80 and the lead frame having the lead 70 provided in the lead frame are disposed on the heat block 101, the heat block 101 may heat the semiconductor chip 80 and the lead frame at a predetermined heating temperature in order to smoothly perform a bonding operation.

The wire spool 110 may supply the wound bonding wire 90 to the capillary 150, such that the capillary 150 may electrically connect the pad 85 of the semiconductor chip 80 to the lead 70 of the lead frame through the bonding wire 90. The bonding wire 90 may be formed of a conductive material, e.g., gold (Au) which has excellent conductivity.

The capillary 150 may guide the bonding wire 90 to the desired regions to be bonded by quickly moving between the desired regions, i.e., regions of the pad 85 of the semiconductor chip 80 and the lead 70 of the lead frame to be bonded. In a first step, i.e., a bonding step, the capillary 150 may move between the desired regions to bond one end of the bonding wire 90 to the pad 85 and another end of the bonding wire 90 to the lead 70. Accordingly, the pad 85 of the semiconductor chip 80 and the lead 70 of the lead frame may be electrically connected to each other through the bonding wire 90 (not shown). In a second step, i.e., a cutting step, after the pad 80 and lead 70 are bonded to each other through the bonding wire 90, the capillary 150 may cut a tail of the bonding wire 90, i.e., disconnect a portion of the bonding wire 90 connecting the pad 85 and lead 70 from the wire spool 110.

The wire clamp 130 may be disposed between the capillary 150 and the diverter 120 to control the supply of the bonding wire 90 to the capillary 150. In other words, the wire clamp 130 may be opened and closed to control supply of the bonding wire 90 to the capillary 150. For example, the wire clamp 130 may be open to continuously supply the bonding wire 90 to the capillary 150, i.e., during the bonding step, and the wire clamp 130 may close to stop supply of the bonding wire 90 to the capillary 150, i.e., during the tail cutting step, so the portion of the bonding wire 90 connecting the pad 85 and lead 70 may be disconnected from the wire spool 110.

As illustrated in FIGS. 1-2, the wire clamp 130 may include a pair of clamp arms 133 disposed a predetermined distance apart from each other such that the bonding wire 90 may pass therebetween, a clamp body 131 coupled to the clamp arms 133 and configured to increase or decrease the distance between the clamp arms 133 with respect to a process step to be performed, clamping sections 136 provided in the pair of clamp arms 133, and abrasion prevention members 140 in the clamping sections 136 to prevent abrasion during contact with the bonding wire 90. As illustrated in FIG. 2, the clamping sections 136 may have a concave shape such that when they approach each other, they may come in contact with and clamp the bonding wire 90.

The pair of clamp arms 133 may include a first clamp arm 134 at one side of the bonding wire 90 supplied to the capillary 150, and a second clamp arm 135 at the other side of the bonding wire 90. The first and second clamp arms 134 and 135 may be disposed a predetermined distance apart to face one another. The first and second clamp arms 134 and 135 may be formed of a conductive material. Therefore, when the bonding wire 90 passes between the first clamp arm 134 and the second clamp arm 135, the WBMS 170 may supply a detection current to the bonding wire 90 through the clamp arms 133 to monitor the wire bonding process.

The clamp body 131 of the wire clamp 130 may be coupled to one end of the pair of clamp arms 133. The clamp body 131 may include a clamp unit 132 for increasing or decreasing the distance between the clamp arms 133 with respect to a process step performed, e.g., a bonding step or a cutting step. The clamp unit 132 may be any suitable unit capable of controlling distance between the clamp arms. For example, the clamp unit 132 may be a piezoelectric element which expands or contracts by a predetermined length in response to current applied thereto. In other words, the clamp unit 132, i.e., the piezoelectric element, in the clamp body 131 may expand or contract to increase or decrease, respectively, the distance between the first clamp arm 134 and the second clamp arm 135.

For example, when a voltage is applied to the clamp unit 132, e.g., the piezoelectric element, the piezoelectric element may expand to a predetermined length, thereby pushing the first clamp arm 134 away from the second clamp arm 135 to increase the distance therebetween, i.e., to open the wire clamp 130. As a result, the bonding wire 90 clamped by the clamp arms 133 may be released and supplied to the capillary 150. When the voltage applied to the piezoelectric element is cut off, the piezoelectric element may contract to a predetermined length, thereby letting the first and second clamp arms 134 and 135 move toward each other, i.e., to close the wire clamp 130. As a result, the bonding wire 90 supplied to the capillary 150 may be clamped by the clamp arms 133, so supply of the bonding wire 90 to the capillary 150 may be stopped.

The clamping sections 136 of the wire clamp 130 may define a concave portion in the first and second clamp arms 134 and 135, as illustrated in FIG. 2. The clamping sections 136 may be in an inner surface of each of the first and second clamp arms 134 and 135, so the clamping sections 136 may be in contact with convex surfaces of the bonding wire 90 when the first clamp arm 134 and the second clamp arm 135 approach each other. In particular, the clamping sections 136 may include first and second clamping section 137 and 138 in the first and second clamp arms 134 and 135, respectively. Accordingly, surfaces 139 of the clamping sections 136, e.g., surface 139 of the first clamping section 137 illustrated in FIG. 5, may contact, e.g., directly contact, the bonding wire 90.

The clamping sections 136 may be at a first end of the clamp arms 133, i.e., an end of the clamp arms 133 opposite the clamp body 131, in order to be in contact with sides of the bonding wire 90. In other words, since the pair of clamp arms 133 is composed of the first clamp arm 134 at one side of the bonding wire 90 and the second clamp arm 135 at the other side of the bonding wire 90, the clamping sections 136 may be composed of the first clamping section 137 concavely formed near one end of the first clamp arm 134 so as to come in contact with one side of the bonding wire 90, and the second clamping section 138 concavely formed near the other end of the second clamp arm 135 so as to come in contact with the other side of the bonding wire 90. Since the first and second clamping sections 137 and 138 may be concavely formed so as to come in contact with curved sides of the bonding wire 90, a contact area between the bonding wire 90 and the clamping sections 137 and 138 may be increased as compared to flat clamp arms, i.e., clamp arms without concave portions. As a result, a clamping force transferred from the clamp arms 133 through the clamping sections 136 may be significantly increased.

The surfaces 139 of the clamping sections 136, i.e., surfaces facing the bonding wire 90, may be substantially smooth. For example, the surfaces 139 may be polished by a grinder (not shown) to impart a substantially smooth surface texture to the surfaces 139. Since the surfaces 139 of the clamping sections 136, i.e., portions of the wire clamp 130 contacting the bonding wire during the bonding step, may be substantially smooth, very little contamination may be sustained on the surfaces 139 even when the wire bonding process is performed for a long time. Accordingly, an impedance value measured by the WBMS 170 when monitoring the wire bonding process may correspond to the resultant bonding wire, i.e., to an actual wire bonding state, and not to contaminants thereon, thereby providing improved monitoring accuracy. Therefore, since the WBMS 170 may generate a signal corresponding to the actual wire bonding state, the wire bonding apparatus 100, which may perform the bonding process in accordance with the signal of the WBMS 170, may perform the wire bonding process smoothly, e.g., without wire bonding defects and/or without unexpected discontinuance of the process.

The abrasion prevention members 140 of the wire clamp 130 may be inserted into the clamping sections 136, as illustrated in FIGS. 1-2. The abrasion prevention members 140 may be positioned, such that when the surfaces 139 of the clamping sections 136 contact the surface of the bonding wire 90, surfaces of the abrasion prevention members 140 may also contact the surface of the bonding wire 90. For example, the abrasion prevention members 140 may include at least one surface 43 substantially coplanar with the surfaces 139, as illustrated in FIG. 5, so a contact between the surfaces 139 of the clamping sections 136 and the bonding wire 90 may cause a contact, e.g., a direct contact, between the abrasion prevention members 140 and the bonding wire 90.

The abrasion prevention members 140 may be formed of a hard material, i.e., a material that may not abrade when contacting the bonding wire 90. For example, the abrasion prevention members 140 may be formed of industrial diamond. Accordingly, when the abrasion prevention members 140 are formed of a hard material, the contact between the abrasion prevention members 140 and the bonding wire 90 may not abrade when the wire bonding process is performed for a long time. As a result, when the clamping sections 136 with the abrasion prevention members 140 clamp the bonding wire 90 for a long time, e.g., when the bonding process is performed for a long time, faulty clamping of the bonding wire 90, e.g., due to abrasion, may be avoided or substantially minimized, thereby providing improved processing, e.g., improved clamping reliability and minimized defects due to improper clamping.

The abrasion prevention members 140 may be disposed perpendicularly to the surfaces of the bonding wire 90, i.e., surfaces of the bonding wire 90 contacting the abrasion prevention members 140. For example, as illustrated in FIGS. 2-4, a longitudinal side of the abrasion prevention members 140 may extend along the z-axis in both the first and second clamping sections 137 and 138, and a width of each of the abrasion prevention members 140 may be measured along the x-axis. For example, as illustrated in FIGS. 3-4, each abrasion prevention member 140 may be disposed at a predetermined depth, i.e., a distance as measured along the y-axis, in the clamping sections 136, and may be positioned to contact the bonding wire 90. In other words, a plurality of abrasion prevention members 140 may be disposed at even intervals along a longitudinal direction of the clamping sections 136 coming in contact with the bonding wire 90. The plurality of the abrasion prevention members 140 may be arranged parallel to each other at different depths within the clamping section 136, e.g., at even intervals from each other, as illustrated in FIGS. 2-3. The abrasion prevention members 140 may overlap each other, e.g., completely overlap each other. For example, the abrasion prevention members 140 may be arranged in an alternating structure with portions of the clamping section 136. In other words, as illustrated in FIG. 3, an abrasion prevention member 140 may be between two portions of the clamping section 136, such that the surfaces 139 of the clamping portions 136 and the corresponding surface 143 of the abrasion member 140 therebetween may be substantially coplanar, and may contact the bonding wire 90.

Therefore, since the abrasion prevention members 140 may be disposed perpendicularly to the surfaces of the bonding wire 90, i.e., surfaces of the bonding wire 90 contacting the abrasion prevention members 140, portions of the clamping section 136 may alternate with the abrasion prevention members 140. Thus, even though the abrasion prevention members 140 may be formed of a non-conductive material, e.g., diamond, the clamping sections 136 may contact the bonding wire 90. Accordingly, the WBMS 170 may send a detection current for monitoring the wire bonding process to the bonding wire 90 through the wire clamp 130. As a result, the WBMS 170 may monitor the wire bonding process, even though the abrasion prevention members 140 in the clamping sections 136 may be formed of a non-conductive material and may contact the bonding wire 90.

Further, surfaces 143 of the abrasion prevention member 140 facing the surface of the bonding wire 90, i.e., surfaces coplanar with the surfaces 139 of the clamping sections 136, may be concave, as illustrated in FIG. 5, and may correspond to the convex surface of the bonding wire 90. As described previously with references to the surfaces 139 of the clamping sections 136, the surfaces 143 of the abrasion prevention members 140 may be polished smooth. In other words, the surfaces 139 and 143 may be sufficiently smooth to prevent or substantially minimize adherence of contaminants thereto. Therefore, since the surfaces 143 of the abrasion prevention member 140 of the wire clamp 130 may be polished smooth, the surfaces 143 of the abrasion prevention members 140 contacting the surface of the bonding wire 90 may not be contaminated, even when the wire bonding process is performed for a long time. Reference numeral 141 represents a first abrasion prevention member inserted into the first clamping section 137, and reference numeral 142 represents a second abrasion prevention member inserted into the second clamping section 138.

The WBMS 170 of the wire bonding apparatus 100 may monitor whether the bonding and cutting steps are performed smoothly during the wire bonding process. The WBMS 170 may send detection current to the bonding wire 90 through the wire clamp 130, i.e., a low current, e.g., 0.75 μA, to prevent or substantially minimize damage to the semiconductor chip 80. Then, the WBMS 170 may measure and compare an impedance value between the wire clamp 130, which may be electrically connected to the semiconductor chip 80 through the bonding wire 90, and the heat block 101 disposed under the semiconductor chip 80, thereby monitoring whether the wire bonding process has been performed smoothly or not.

For example, after the bonding step is performed, the WBMS 170 may send a detection current to the bonding wire 90 through the wire clamp 130, and may measure and compare an impedance value between the wire clamp 130 and the heat block 101. When the measured impedance value is higher than a preset first reference value, the WBMS 170 may determine that the bonding step is performed improperly, and may generate an interlock signal to stop the wire bonding process. When the measured impedance value is lower than the present first reference value, the WBMS 170 may determine that the bonding step is performed smoothly so the wire bonding process may continue without interruptions, e.g., the WBMS 170 may not generate an interlock signal for stopping the wire bonding process or may generate a process progress signal confirming continuous operation of the wire bonding process.

In another example, after the cutting step is performed, the WBMS 170 may send a detection current to the bonding wire 90 through the wire clamp 130, and may measure and compare an impedance value between the wire clamp 130 and the heat block 101, thereby monitoring whether the cutting step of the bonding wire 90 has been performed smoothly. When the measured impedance value is lower than a preset second reference value, the WBMS 170 may determine that the bonding wire 90 is not cut properly, and may generate an interlock signal to stop the wire bonding process. When the measured impedance value is higher than the preset second reference value, the WBMS 170 may determine that the tail of the bonding wire is 90 cut properly, so the wire bonding process may continue without interruptions, e.g., the WBMS 170 may not generate an interlock signal for stopping the wire bonding process or may generate a process progress signal confirming continuous operation of the wire bonding process.

According to the exemplary embodiments, the abrasion prevention members 140 may be provided in the clamping sections 136 to contact the bonding wire 90, so the abrasion prevention members 140 may not be abraded by contacting the bonding wire 90 even after the wire bonding process has been performed for a long time. As a result, the clamping sections 136 including the abrasion prevention members 140 may clamp the bonding wire 90 reliably even when the process is performed for a long time. In other words, even after a long period of performance of the wire bonding process, the abrasion prevention members 140 may provide proper contact with and clamping of the bonding wire 90. Therefore, unreliable clamping of the bonding wire 90 due to abrasion of clamping sections may be avoided or substantially minimized.

Further, since the abrasion prevention members 140 may be perpendicular to surfaces of the bonding wire 90 contacting the abrasion prevention members 140, even though the abrasion prevention members 140 are formed of a non-conductive material within the clamping sections contacting the bonding wire, the WBMS 170 may send a detection current for monitoring the wire bonding process through conductive portions of the clamping sections 136, i.e., portions between adjacent abrasion prevention members 140. As a result, the WBMS 170 may monitor the wire bonding process, even though non-conductive abrasion prevention members 140 may be provided in the clamping sections 136 contacting the bonding wire 90.

In addition, since portions of the wire clamp 130 that come in contact with the surface of the bonding wire 90, i.e., surfaces 139 of the clamping sections 136 and surfaces 143 of the abrasion prevention members 140, may be polished smooth, there is no significant contamination even after the wire bonding process has been performed for a long time, e.g., contaminants may not remain on or adhere to the smooth surfaces of the wire clamp 130. As a result, an impedance value measured by the WBMS 170 to monitor the wire bonding process may be accurate and may correspond to an actual wire bonding state. Therefore, since the WBMS 170 may generate the same signal as in the actual wire bonding state, the wire bonding apparatus performing the process in accordance with the signal may smoothly perform the wire bonding process without any, e.g., wire bonding defects or unexpected stoppage of the process.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A wire clamp, comprising:
   a pair of clamp arms at a predetermined distance from each other to define an interval therebetween for a bonding wire;
   a clamp body coupled to the clamp arms, the clamp body configured to adjust the predetermined distance between the clamp arms with respect to a process to be performed;
   a clamping section in each clamp arm, the clamping section having concave portions facing the interval between the clamp arms, the concave portions being configured to contact the bonding wire when the clamp arms are brought close together; and
   at least one abrasion prevention member in each clamping section, the abrasion prevention members being configured to prevent abrasion during contact with the bonding wire, wherein each clamping section includes a plurality of abrasion prevention members, the abrasion prevention members being disposed at even intervals from each other, the intervals being measured along a direction parallel to a direction of the bonding wire.

2. The wire clamp as claimed in claim 1, wherein surfaces of the clamping sections and surfaces of the abrasion prevention members are configured to contact a surface of the bonding wire when the clamp arms are brought close together.

3. The wire clamp as claimed in claim 2, wherein surfaces of the abrasion prevention members facing the interval between the clamp arms include concave portions, the concave portion corresponding to a convex surface of the bonding wire.

4. The wire clamp as claimed in claim 2, wherein the surfaces of the clamping sections and of the abrasion prevention members configured to contact the bonding wire are substantially smooth.

5. The wire clamp as claimed in claim 1, wherein the abrasion prevention members include a hard material, the hard material exhibiting no abrasion when contacted by the bonding wire.

6. The wire clamp as claimed in claim 5, wherein the hard material is diamond.

7. The wire clamp as claimed in claim 1, wherein the clamp arms and the clamping sections include a conductive material, and
   the abrasion prevention members are positioned perpendicularly to a first surface of the bonding wire, the first surface of the bonding wire being configured to contact the abrasion prevention members.

8. The wire clamp as claimed in claim 1, wherein each abrasion prevention member is positioned between portions of a corresponding clamping section in an alternating pattern.

9. The wire clamp as claimed in claim 1, wherein surfaces of the abrasion prevention members facing the interval between the clamp arms include concave portions, surfaces of the concave portions of the abrasion prevention members and surfaces of the concave portions of the corresponding clamping sections being substantially coplanar.

10. The wire clamp as claimed in claim 1, wherein at least a first surface of each abrasion prevention member is in direct contact with a corresponding clamping section, and a second surface of each abrasion prevention member is in direct contact with the bonding wire when the clamp arms are brought close together, the first and second surfaces being different from each other.

11. A wire bonding apparatus, comprising:
    a capillary configured to guide a bonding wire to predetermined regions, the capillary being movable between the predetermined regions; and
    a wire clamp including:
      a pair of clamp arms at a predetermined distance from each other to define an interval therebetween for a bonding wire, the pair of clamp arms being configured to control supply of the bonding wire to the capillary;
      a clamp body coupled to the clamp arms, the clamp body configured to adjust the predetermined distance between the clamp arms with respect to a process to be performed;
      a clamping section in each clamp arm, the clamping section having concave portions facing the interval between the clamp arms, the concave portions being configured to contact the bonding wire when the clamp arms are brought close together; and
      at least one abrasion prevention member in each clamping section, the abrasion prevention members being configured to prevent abrasion during contact with the bonding wire, wherein each clamping section includes a plurality of abrasion prevention members, the abrasion prevention members being disposed at even intervals from each other, the intervals being measured along a direction parallel to a direction of the bonding wire.

12. The wire bonding apparatus as claimed in claim 11, wherein surfaces of the clamping sections and surfaces of the abrasion prevention members are configured to contact a surface of the bonding wire.

13. The wire bonding apparatus as claimed in claim 12, wherein surfaces of the abrasion prevention members facing the bonding wire have a concave shape, the concave shape corresponding to a convex surface of the bonding wire.

14. The wire bonding apparatus as claimed in claim 12, wherein the surfaces of the clamping sections and the abrasion prevention members configured to contact the bonding wire are substantially smooth.

15. The wire bonding apparatus as claimed in claim 11, wherein the abrasion prevention members include a hard material, the hard material exhibiting no abrasion when contacted by the bonding wire.

16. The wire bonding apparatus as claimed in claim 15, wherein the hard material is diamond.

17. The wire bonding apparatus as claimed in claim 11, wherein the clamp arms and the clamping sections include a conductive material, and the abrasion prevention members are positioned perpendicularly to a first surface of the bonding wire, the first surface of the bonding wire being configured to contact the abrasion prevention members.

* * * * *